US008570026B2

(12) United States Patent (10) Patent No.: US 8,570,026 B2
Liu (45) Date of Patent: Oct. 29, 2013

(54) MULTIMETER HAVING CLAMPING MEANS FOR TEST PROBE

(75) Inventor: Shao-Lin Liu, Taipei (TW)

(73) Assignee: Chung Instrument Electronics Industrial Co., Ltd., New Taipei (TW)

( * ) Notice: Subject to any disclaimer, the term of this patent is extended or adjusted under 35 U.S.C. 154(b) by 234 days.

(21) Appl. No.: 13/204,714

(22) Filed: Aug. 7, 2011

(65) Prior Publication Data

US 2013/0033253 A1 Feb. 7, 2013

(51) Int. Cl.
*G01R 1/20* (2006.01)

(52) U.S. Cl.
USPC ............ 324/115; 324/114; 324/156; 324/157

(58) Field of Classification Search
USPC .......................................................... 324/115
See application file for complete search history.

(56) References Cited

U.S. PATENT DOCUMENTS

| 3,840,808 A | * | 10/1974 | Liebermann | .................. 324/127 |
| D412,294 S | * | 7/1999 | Kaise et al. | .................... D10/78 |
| D435,796 S | * | 1/2001 | Tomiyama et al. | ............ D10/78 |
| D476,246 S | * | 6/2003 | Kuramoto et al. | ............. D10/78 |
| 2011/0012589 A1 | * | 1/2011 | Greenberg | .................... 324/127 |

* cited by examiner

*Primary Examiner* — Melissa Koval
*Assistant Examiner* — Stephen G Armstrong
(74) *Attorney, Agent, or Firm* — Chun-Ming Shih; HDLS IPR Services

(57) ABSTRACT

A multi-meter for a test probe includes a main body, two test probes and a clamping means. The test probe includes a test pin, a connecting portion, and a lead electrically connected between the test pin and the connecting portion. The connecting portion is inserted into the main body and electrically thereto. The clamping means comprises a liftable cover and a clamping portion formed on the liftable cover. One end of the liftable cover is pivotally connected to the main body. The clamping portion is configured to clamp the test pin. By this structure, the test pin is clamped by the camping portion to help a user carrying out the measurement.

4 Claims, 5 Drawing Sheets

MULTIMETER HAVING CLAMPING MEANS FOR TEST PROBE

BACKGROUND OF THE INVENTION

1. Field of the Invention

The present invention relates to a multi-meter, and in particular to a multi-meter having a clamping means for a test probe.

2. Description of Prior Art

A multi-meter is a common electronic instrument for multi-purpose measurement, which is capable of generating composite functions of an ampere meter, a voltage meter and an ohm meter. Sometimes, the multi-meter is called as a Volt-Ohm-Milliammeter. In use, the multi-meter is provided with at least one test probe for measuring the voltage, ampere and ohm of various electronic products without being limited by space or environment.

A conventional multi-meter includes a main body and a pair of test probes. The main body is provided with two insertion holes. Each of the test probes comprises a test pin, a connecting portion, and a lead electrically connected to the test pin and the connecting portion. The connecting portion is inserted into the insertion hole of the main body. The test pin and the lead extend outwardly from the main body.

Although the conventional multi-meter is capable of measuring the ampere, voltage and ohm of various electronic products, a user has to grasp the main body by one hand and grasp the two test probes by the other hand for the measurement. Thus, when the distance between two measured points of an object to be measured exceeds the range which one hand of the user can reach, the user has to release the main body and grasp the two test probes by two hands. As a result, the main body is suspended in midair and even swings, so that the user cannot read the measured value on the main body easily, which makes the user inconvenient in use.

SUMMARY OF THE INVENTION

The present invention is to provide a multi-meter having a clamping means for a test probe, in which the test pin of the test probe can be clamped on a clamping portion to help the user carrying out the measurement.

The present invention provides a multi-meter for a test probe, including a main body, at least one test probe, and a clamping means. The test probe comprises a test pin, a connecting portion, and a lead electrically connected to the test pin and the connecting portion. The connecting portion is inserted into the main body and electrically thereto. The clamping means comprises a liftable cover and a clamping portion formed on the liftable cover. One end of the liftable cover is pivotally connected to the main body. The clamping portion is configured to clamp the test pin.

The present invention has advantageous features as follows. The test pin is fixed to one side of the main body. The user can carry out the measurement by one hand or two hands. Further, the user can read the measured value directly from a display screen provided on the front surface of the main body, which improves the convenience in use. On the other hand, the clamping means can be stored in an accommodating chamber without occupying too much space when not in use. With the mutual engagement between a locking hook and a locking trough, the liftable cover can be firmly positioned when being lifted outwardly. Further, with the mutual engagement between a pit and an elastic protrusion, the liftable cover can be firmly positioned and stored when being covered inwardly.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
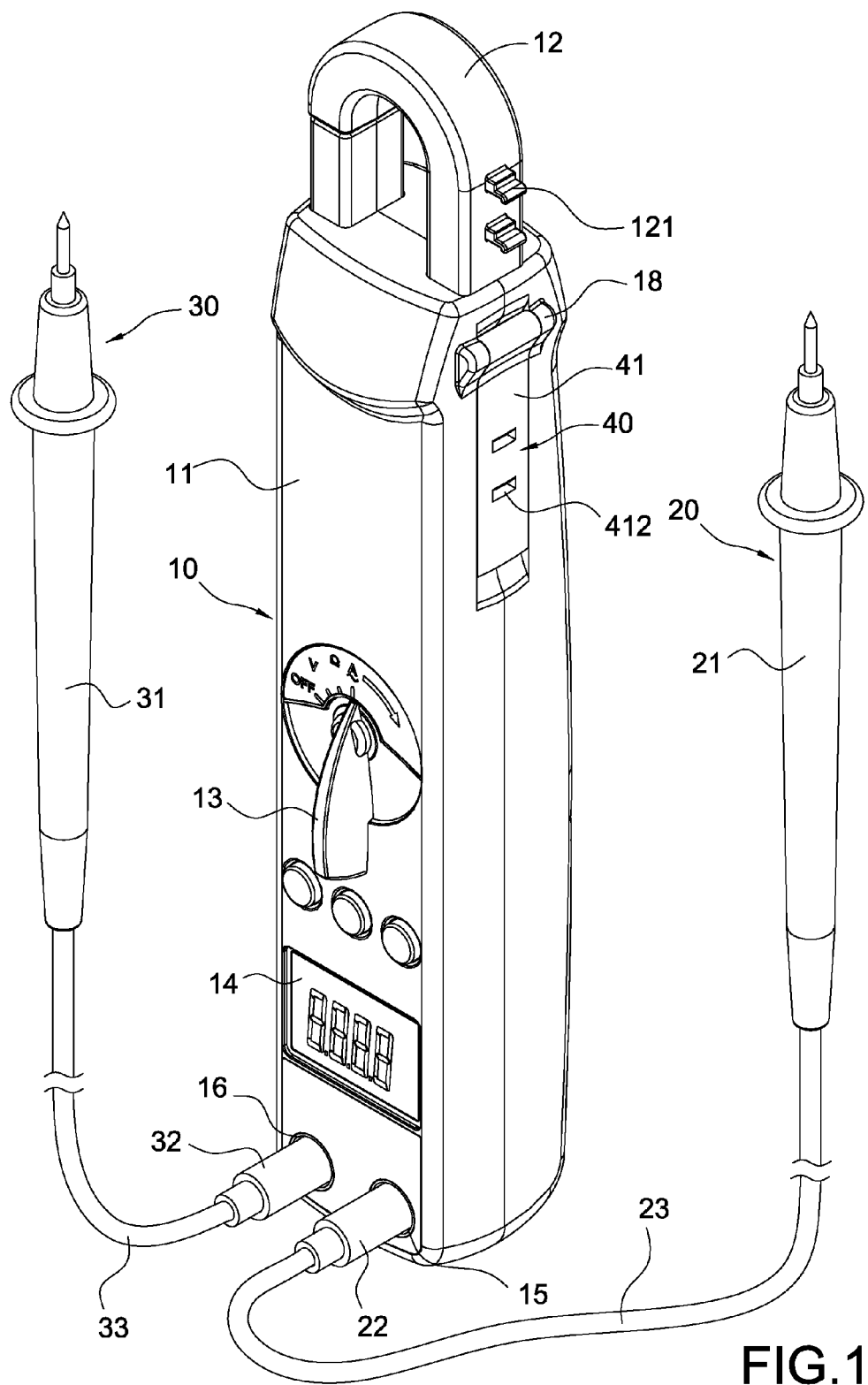
FIG. 1 is an assembled view showing the external appearance of the multi-meter of the present invention.
Figure 2:
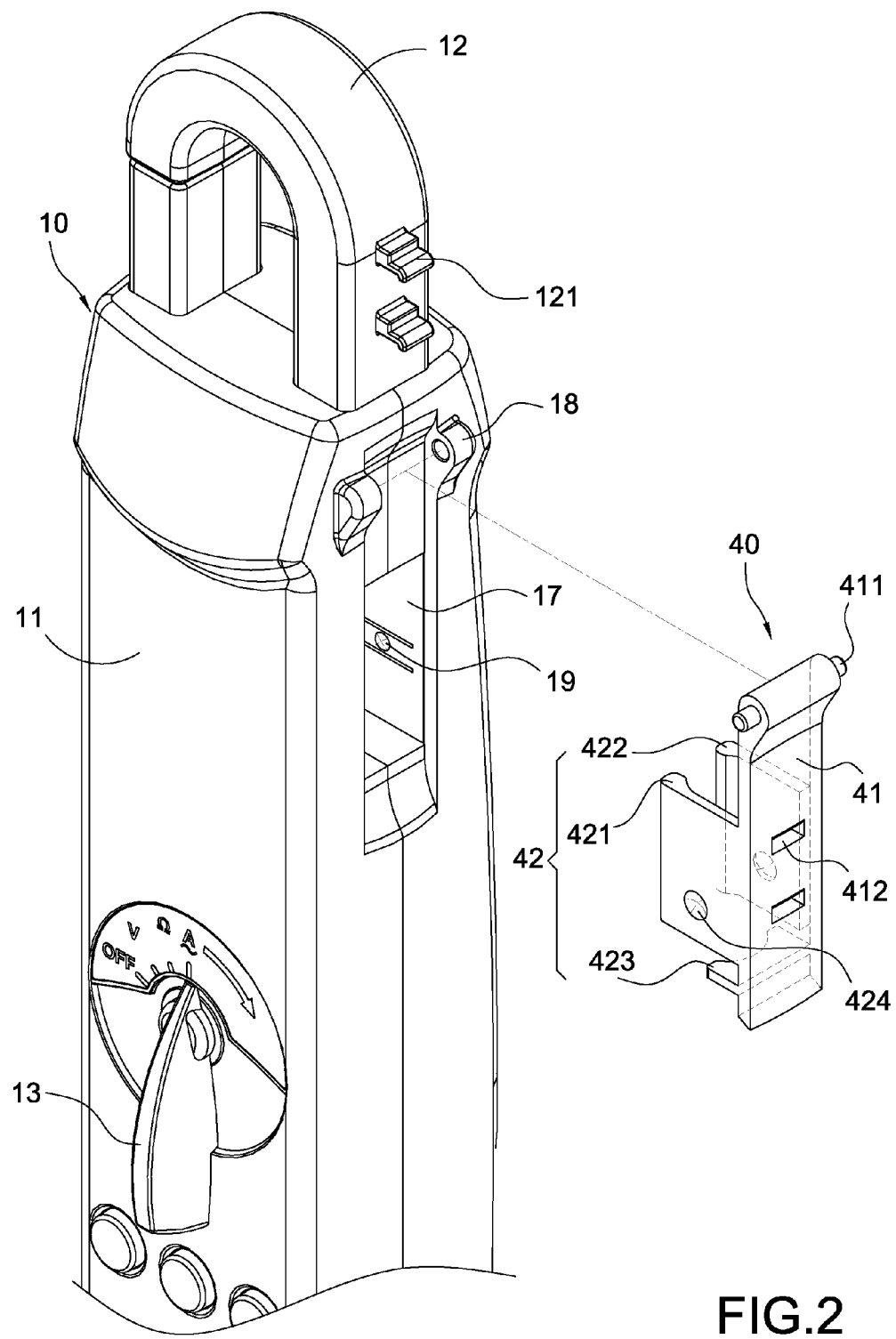
FIG. 2 is an exploded view showing the main body and the clamping means of the present invention.

Please refer to FIGS. 1 and 2. The present invention provides a multi-meter having a clamping means for a test probe, which includes a main body 10, a pair of test probes 20, 30, and a clamping means 40.

The main body 10 comprises a rectangular casing 11, in which a plurality of electrical elements (not shown) is mounted. The upper portion of the casing 11 is provided with a measuring hook portion 12 for measuring an electric current of an electric wire. The middle portion of the casing 11 is provided with a switch knob 13 for selectively switching the functions for measuring the voltage, ampere and ohm as well as the ON/OFF of a power switch. A display screen 14 is provided below the switch knob 13 for displaying the measured data of the voltage, ampere or ohm. Two insertion holes 15, 16 are provided below the display screen 14. The right side of the casing 11 is provided with a rectangular accommodating space 17. Two pivotal bases 18 are formed to face each other above the accommodating space 17.

In the present embodiment, there are two test probes 20 and 30, but it is not limited thereto. The test probe 20 comprises a test pin 21, a connecting portion 22, and a lead 23 electrically connected to the test pin 21 and the connecting portion 22. Similarly, the other test probe 30 comprises a test pin 31, a connecting portion 32, and a lead 33 electrically connected to the test pin 31 and the connecting portion 32. The connecting portions 22, 32 are respectively inserted into the insertion holes 15, 16 of the main body 10 and electrically connected to the electrical elements in the main body 10.

The clamping means 40 comprises a liftable cover 41 and a clamping portion 42. A pivotal shaft 411 is formed above the liftable cover 41 and pivotally disposed between the pivotal bases 18. The middle portion of the liftable cover 41 is provided with two locking troughs 412. The number of the locking troughs 412 is not limited thereto, and only one locking trough 412 is feasible. The outer surface of the measuring hook portion 12 is formed with two locking hooks 121. The locking hooks 121 are engaged in the locking troughs 412 for firmly poisoning the liftable cover 41. In the present embodiment, the clamping portion 42 is formed on the inner side surface of the liftable cover 41. The clamping portion 42 includes two longitudinal sheets 421, 422 in parallel to each other as well as a transverse sheet 423 formed perpendicular to each longitudinal sheet 421, 422 and located on one side thereof. The longitudinal sheets 421, 422 cooperate with the transverse sheet 423 to clamp the test pin 21 or 31. In addition, the outer end surfaces of the longitudinal sheets 421, 422 are provided with a pit 424 respectively. Both inner walls of the accommodating chamber 17 are formed with an elastic protrusion 19 respectively. The elastic protrusion 19 is engaged with the pit 424, whereby the liftable cover 41 can be firmly positioned in the accommodating chamber 17.

Figure 3:
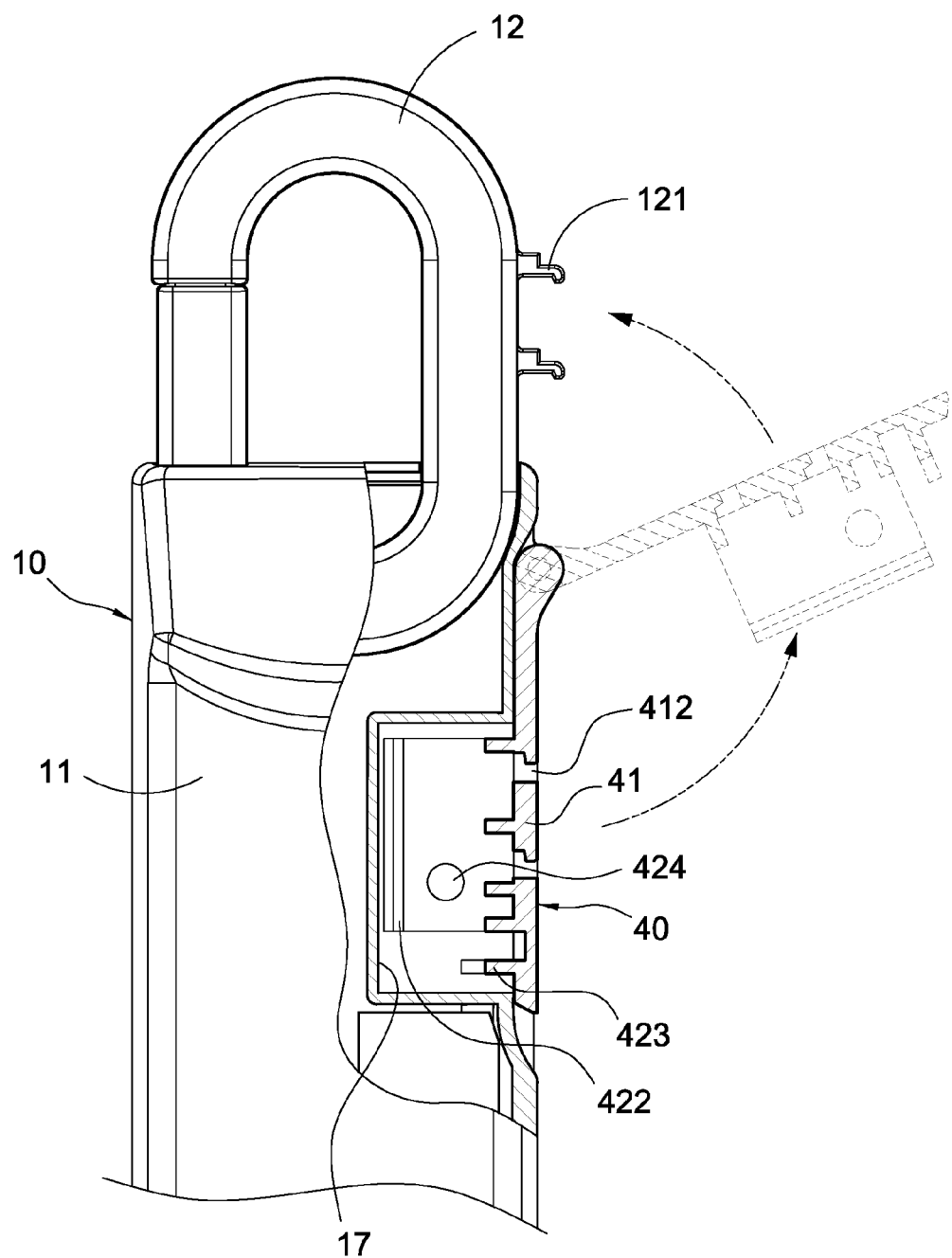
FIG. 3 is an action view showing that the liftable cover is lifted upwardly with respect to the main body of the present invention.
Figure 4:
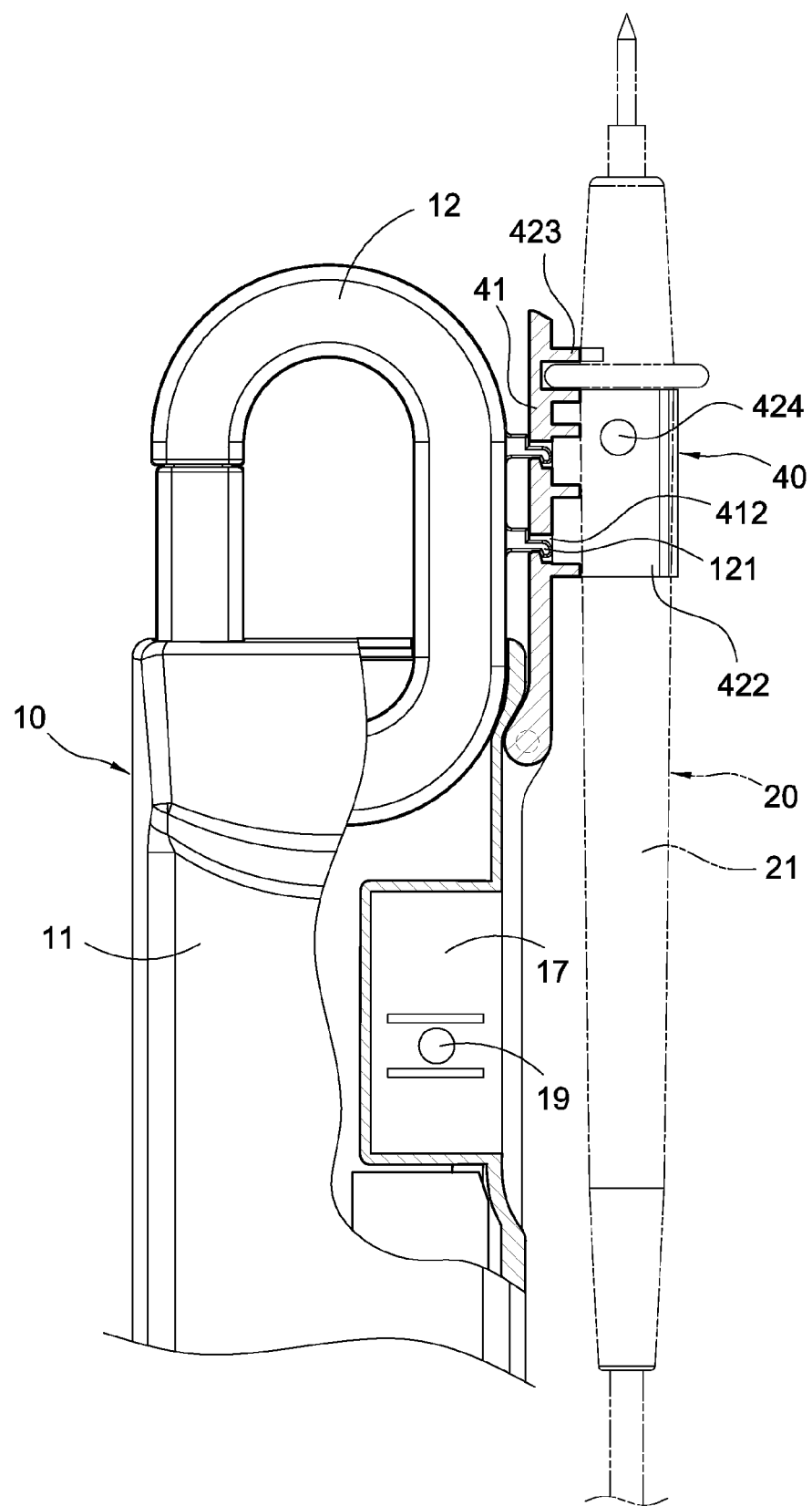
FIG. 4 is a schematic view (I) showing that the test probe is fixed onto the clamping means of the present invention.
Figure 5:
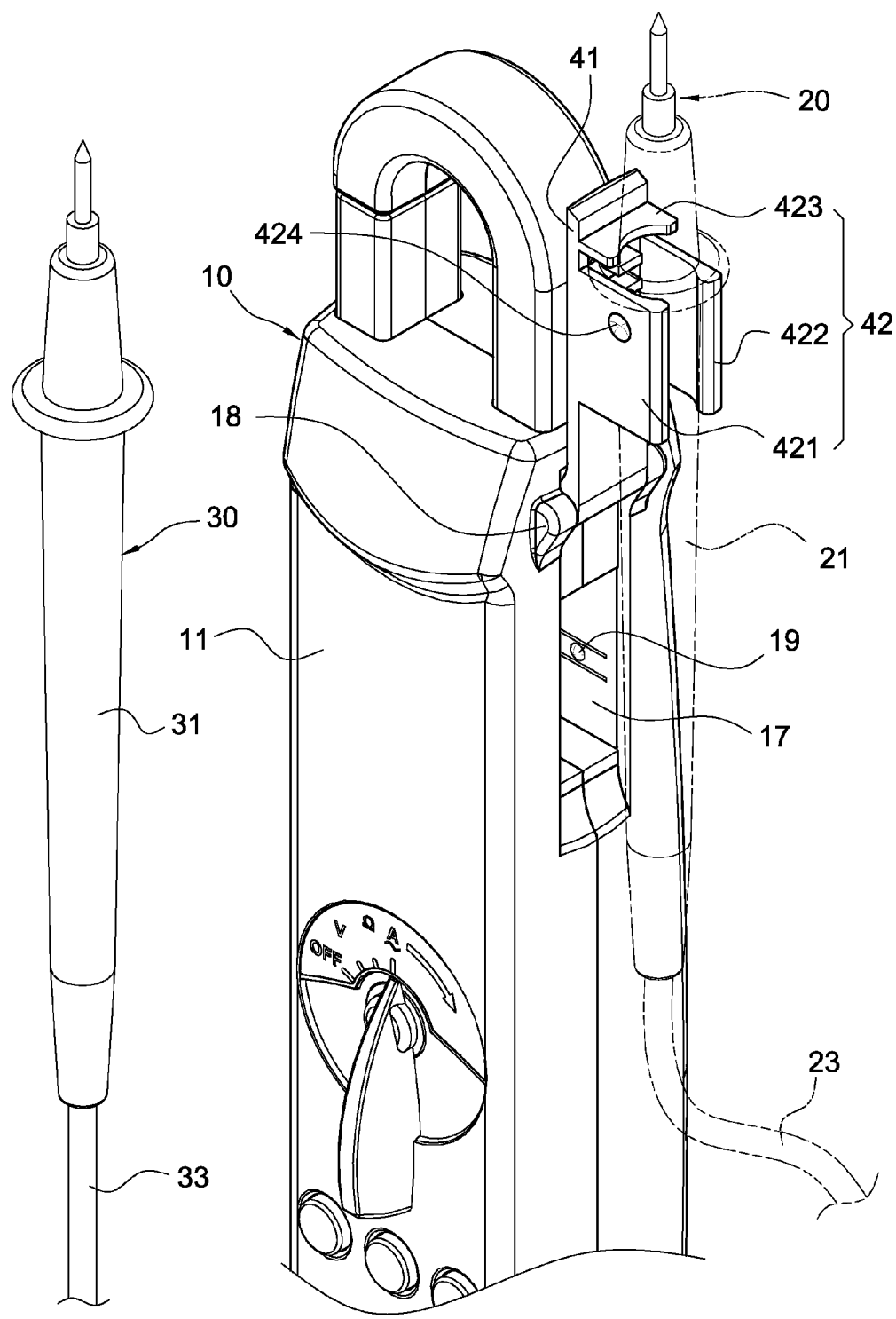
FIG. 5 is a schematic view (II) showing that the test probe is fixed onto the clamping means of the present invention.

Please refer to FIGS. 3 to 5. In use, as shown in FIG. 1, the connecting portion of the test probe 20, 30 is inserted into the insertion hole 15, 16 of the main body 10 respectively. Next, the user lifts the liftable cover 41. At this time, as shown in FIG. 3, the elastic protrusions 19 are released from the pits 24 of the longitudinal sheets 421, 422. Next, the liftable cover 41 is rotatable by using the connecting portion between the pivotal shaft 41 and the pivotal bases 18 as the center of rotation. When the liftable cover 41 rotates 180 degrees, as shown in FIG. 4, the locking trough 412 is firmly engaged by the locking hook 121 with the test pin 21 of one test probe 20 being disposed in the clamping portion 42. At this time, the longitudinal sheets 421, 422 cooperate with the transverse sheet 423 to clamp the test pin 21. When the distance between two measured points of an electric product is large, the user can grasp the main body 10 by one hand, and grasp the test probe 30 by the other hand for measurement. Since the main body 10 can be grasped by one hand, the user can read the measured value from the display screen 14, thereby increasing the convenience in use greatly.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A multi-meter, including:
   a main body;
   at least one test probe including a test pin, a connecting portion, and a lead electrically connected between the test pin and the connecting portion; and
   a clamping means comprising a liftable cover and a clamping portion formed on the liftable cover, one end of the liftable cover being pivotally connected to the main body, the clamping portion being configured to clamp the test pin,
   wherein the main body comprises a casing, the casing is provided with an accommodating chamber, one end of the accommodating chamber is formed with a pivotal base, a pivotal shaft is formed on the liftable cover, the pivotal shaft is pivotally connected with the pivotal base, and the liftable cover covers the accommodating chamber,
   wherein the clamping portion comprises two longitudinal sheets in parallel to each other as well as a transverse sheet positioned perpendicular to the two longitudinal sheets and located on one side thereof, and the two longitudinal sheets cooperate with the transverse sheet to clamp the test pin, and
   wherein an end surface of one of the longitudinal sheets is provided with a pit, an inner wall of the accommodating chamber is formed with an elastic protrusion, the elastic protrusion is engaged with the pit, and the two longitudinal sheets and the transverse sheet are stored in the accommodating chamber.

2. The multi-meter for a test probe according to claim 1, wherein a measuring hook portion is provided above the casing, an outer end surface of the measuring hook portion is provided with a locking hook, the liftable cover is provided with a locking trough, and the locking hook is engaged with the locking trough.

3. The multi-meter for a test probe according to claim 1, wherein the casing is an elongate body, a middle portion of the elongate body is provided with a switch knob, and a display screen is provided below the switch knob.

4. The multi-meter for a test probe according to claim 3, wherein the accommodating chamber and the display screen are located on two adjacent sides of the elongate body.

* * * * *